(12) United States Patent
Choi et al.

(10) Patent No.: US 10,510,429 B2
(45) Date of Patent: Dec. 17, 2019

(54) MEMORY DEVICE PERFORMING TEST ON MEMORY CELL ARRAY AND METHOD OF OPERATING THE SAME

(71) Applicant: Samsung Electronics Co., Ltd., Suwon-si, Gyeonggi-do (KR)

(72) Inventors: Jin-yong Choi, Seoul (KR); Kyung-ryun Kim, Seoul (KR); Woong-dai Kang, Seongnam-si (KR); Hyun-chul Yoon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/007,528

(22) Filed: Jun. 13, 2018

(65) Prior Publication Data

US 2019/0130987 A1    May 2, 2019

(30) Foreign Application Priority Data

Oct. 27, 2017  (KR) .......................... 10-2017-0140810

(51) Int. Cl.
| | |
|---|---|
| *G11C 29/04* | (2006.01) |
| *G11C 29/24* | (2006.01) |
| *G11C 29/12* | (2006.01) |
| *G11C 11/4094* | (2006.01) |
| *G11C 11/408* | (2006.01) |

(52) U.S. Cl.
CPC .......... *G11C 29/12* (2013.01); *G11C 11/4094* (2013.01); *G11C 11/4085* (2013.01); *G11C 29/04* (2013.01); *G11C 29/24* (2013.01); *G11C 2029/1202* (2013.01); *G11C 2029/1204* (2013.01)

(58) Field of Classification Search
CPC ................................. G11C 29/04; G11C 29/24
USPC ................................................... 365/201, 149
See application file for complete search history.

(56) References Cited

U.S. PATENT DOCUMENTS

| | | | | |
|---|---|---|---|---|
| 4,907,200 A | * | 3/1990 | Ikawa ................. | G11C 11/4085 365/189.09 |
| 5,184,326 A | * | 2/1993 | Hoffmann ........... | G11C 11/4094 365/149 |
| 5,255,235 A | * | 10/1993 | Miyatake ............ | G11C 11/4094 365/149 |

(Continued)

FOREIGN PATENT DOCUMENTS

| | | |
|---|---|---|
| KR | 2006-0084104 A | 7/2006 |
| KR | 10-0762872 B1 | 10/2007 |

(Continued)

*Primary Examiner* — Son L Mai
(74) *Attorney, Agent, or Firm* — Harness, Dickey and Pierce, P.L.C.

(57) ABSTRACT

A memory device including a memory cell array connected to a first bit line, first word lines, and second word lines, the memory cell array including a first memory cell and a second memory cell, the first memory cell being connected between the first word lines and the first bit line, and the second memory cell being connected between the second word line and the first bit line; a first word line driver configured to drive the first word lines; a second word line driver configured to drive the second word lines; and a test manager configured to drive second word lines to change a capacitance of the first bit line, and after the capacitance of the first bit line is changed, drive first word lines to test the first word lines.

20 Claims, 11 Drawing Sheets

(56) References Cited

U.S. PATENT DOCUMENTS

| | | | | |
|---|---|---|---|---|
| 5,532,963 | A * | 7/1996 | Kushiyama | G11C 29/02 365/149 |
| 5,768,204 | A * | 6/1998 | Muraoka | G11C 7/065 365/149 |
| 6,366,511 | B2 * | 4/2002 | Rieger | G11C 29/028 365/201 |
| 6,768,687 | B2 * | 7/2004 | Kaihatsu | G11C 7/02 365/149 |
| 6,950,353 | B1 * | 9/2005 | Kim | G11C 29/24 365/149 |
| 7,755,964 | B2 | 7/2010 | Jung et al. | |
| 8,867,282 | B2 | 10/2014 | Yun et al. | |
| 9,251,912 | B2 | 2/2016 | Lee et al. | |
| 9,455,049 | B2 | 9/2016 | Lee et al. | |

FOREIGN PATENT DOCUMENTS

| | | |
|---|---|---|
| KR | 2013-0072009 A | 7/2013 |
| KR | 2014-0083592 A | 7/2014 |
| KR | 2015-0064449 A | 6/2015 |

\* cited by examiner

MEMORY DEVICE PERFORMING TEST ON MEMORY CELL ARRAY AND METHOD OF OPERATING THE SAME

CROSS-REFERENCE TO RELATED APPLICATION

This application claims the benefit of Korean Patent Application No. 10-2017-0140810, filed on Oct. 27, 2017, in the Korean Intellectual Property Office, the disclosure of which is incorporated herein in its entirety by reference.

BACKGROUND

Example embodiments of the present inventive concepts relate to a memory device and/or a method of operating the same. For example, at least some example embodiments relate to a memory device which performs tests on a memory cell array and/or a method of operating same.

Memory devices may be implemented by using semiconductors including materials such as silicon (Si), germanium (Ge), gallium arsenide (GaAs), and indium phosphide (InP). The memory devices may be classified into volatile memory devices and nonvolatile memory devices.

A nonvolatile memory device is a memory device in which stored data is not erased when the memory device is out of power supply. The nonvolatile memory devices may include NAND flash memory (NAND), vertical NAND (VNAND), NOR flash memory, resistive random access memory (RRAM), phase-change memory (PRAM), magnetoresistive random access memory (MRAM), and the like.

A volatile memory device is a memory device in which stored data is erased when the memory device is out of power supply. The volatile memory devices may include static random access memory (SRAM), dynamic random access memory (DRAM), latch, flip-flop, register.

With advances in technology, there have been efforts to reduce the size of the memory devices. However, without actually manufacturing the memory devices, it is difficult to perform tests to determine the effects of reducing the size of the memory devices. On the other hand, when the memory devices are actually manufactured, it is difficult to apply results from the tests to the memory devices, and a long period of time and a high cost are required to manufacture the reduced size memory device and/or remanufacture the memory device to correct issues discovered during the test.

SUMMARY

At least some example embodiments of the present inventive concepts relate to a memory device which may mock a memory cell array having a high cell-per-bit line.

At least some example embodiments of the present inventive concepts also relate to a memory device which may perform a test on a memory cell array having a high cell-per-bit line.

According to an example embodiment of the present inventive concepts, there is provided a memory device, including a memory cell array connected to a first bit line, first word lines, and second word lines, the memory cell array including a first memory cell and a second memory cell, the first memory cell being connected between the first word lines and the first bit line, and the second memory cell being connected between the second word lines and the first bit line; a first word line driver configured to drive the first word lines; a second word line driver configured to drive the second word lines; and a test manager configured to control the first word line driver and the second word line driver in a test mode in such a way that the second word lines are driven to change a capacitance of the first bit line, and after the capacitance of the first bit line is changed, the first word lines are driven to test the first word lines.

According to another example embodiment of the present inventive concepts, there is provided a volatile memory device, including a memory cell array including a first bit line and a plurality of word lines, the first bit line simultaneously connected to a first memory cell to be tested and a plurality of second memory cells that are not to be tested, the plurality of word lines connected to respective ones of the plurality of second memory cells, and each of the first memory cell and the plurality of second memory cells including a first cell capacitor; a word line driver configured to drive at least some of the plurality of word lines in response to a word line enable signal; and a test manager configured to control a connection between the first cell capacitor and the first bit line by outputting the word line enable signal to the word line driver based on a test mode command.

According to another example embodiment of the present inventive concepts, there is provided a method of operating the volatile memory device, the volatile memory device including a first memory cell and a second memory cell, the first memory cell being connected being connected to a first bit line and the second memory cell being connected to a first word line of a plurality of first word lines, the method including receiving a test mode command including capacitance information; driving N first word lines of the plurality of first word lines based on the test mode command, N being an integer greater than or equal to one; and connecting a cell capacitor included in the second memory cell to the first bit line that is connected to the first memory cell, the first memory cell being a memory cell to be tested.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
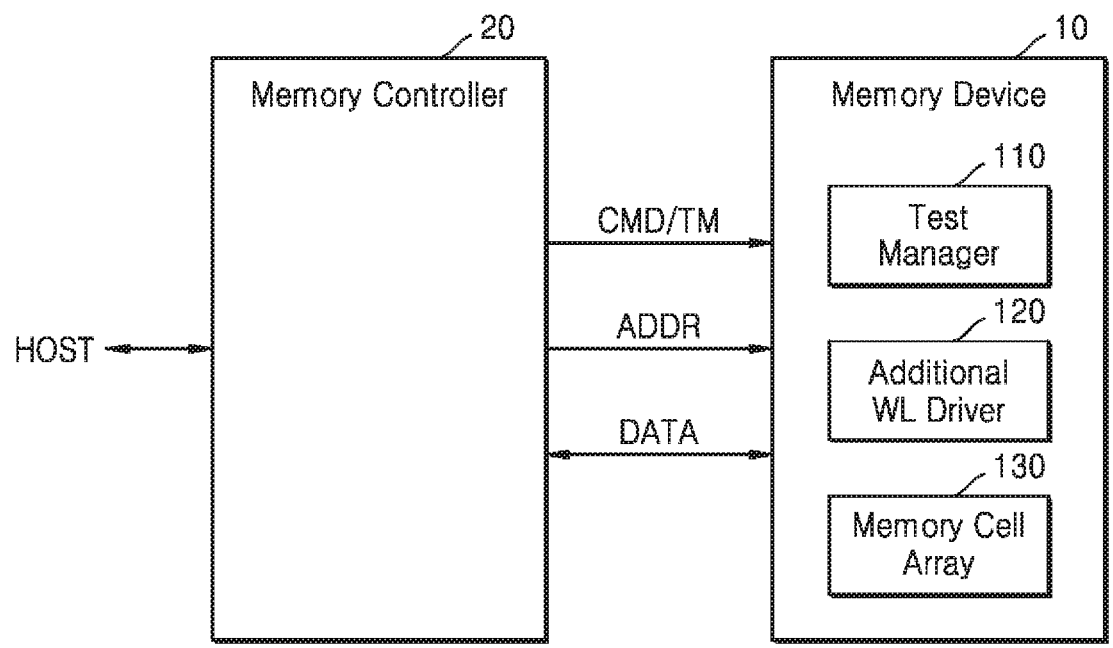
FIG. 1 is a block diagram of a memory system according to an example embodiment.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particular manner, a function or operation specified in a specific block may be performed differently from the flow specified in a flowchart, flow diagram, etc. For example, functions or operations illustrated as being performed serially in two consecutive blocks may actually be performed concurrently, simultaneously, or in some cases be performed in reverse order.

Units and/or devices according to one or more example embodiments may be implemented using hardware, a combination of hardware and software, or storage media storing software. Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

FIG. 1 is a block diagram of a memory system according to an example embodiment.

Referring to FIG. 1, the memory system 1 may include a memory device 10 and a memory controller 20, where the memory device 10 may include a test manager 110, an additional word line driver 120, and a memory cell array 130.

The memory controller 20 may control memory operations such as writing and reading by providing various signals to the memory device 10 through a memory interface (not shown). For example, the memory controller 20 may provide a command CMD and an address ADDR to the memory device 10 and access data stored in the memory cell array 130. The command CMD may include commands for normal memory operations such as writing or reading data. When the memory device 10 includes dynamic random access memory (DRAM) cells, the command CMD may include commands regarding various characteristic operations with respect to the DRAM cells, for example, a refresh command to refresh memory cells. Also, the command CMD may include a test mode command to have the memory device 10 enter a test mode. The test mode TM may be used for evaluating performances of the memory cell array 130 included in the memory device 10 and for performing various tests on the memory cell array 130.

The memory controller 20 may access the memory device 10 in response to a request from the host HOST. The memory controller 20 may communicate with the host HOST through various protocols.

The memory device 10 may be a device used for storing data. The memory device 10 may be a volatile memory device such as DRAM (for example, double data rate synchronous dynamic random access memory (DDR SDRAM), low power double data rate (LPDDR) SDRAM, graphics double data rate (GDDR) SDRAM, rambus dynamic random access memory (RDRAM)), a static random access memory (SRAM), or may be a nonvolatile memory device such as NAND flash memory, vertical NAND flash memory (VNAND), NOR flash memory, resistive random access memory (RRAM), phase-change random access memory (PRAM), magnetoresistive random access memory (MRAM), ferroelectric random access memory (FRAM), spin transfer torque-RAM (STT-RAM). Although the memory device 10 is described as a DRAM herein, example embodiments of the present inventive concepts are not limited thereto.

The test manager 110 may include memory and processing circuitry (not shown).

The memory may include at least one of a volatile memory, non-volatile memory, random access memory (RAM), a flash memory, a hard disk drive, and an optical disk drive.

The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The processing circuitry may be configured, through a layout design or execution of computer readable instructions stored in a memory (not shown), as a special purpose computer to receive the test mode command TM from the memory controller 20 and perform a test on the memory cell array 130 based on the received test mode command TM.

Therefore, the processing circuitry may improve the functioning of the memory device 10 and/or the memory system 1 itself by facilitating testing of a memory cell array 130 having an adjusted cell-per-bit line without actually manufacturing the memory cell array 130 having the tested design.

According to example embodiments of the present inventive concepts, to adjust a bit line capacitance according to a cell-per-bit line, the test manager 110 may control the additional word line driver 120 to drive at least one additional word line. Also, the test manager 110 may perform a test on the memory cell array 130 by driving test word lines to be tested. The test may include writing data to and/or reading the written data from the memory cell array, and evaluating an efficiency of the memory cell array 130 based on a result of the operations of writing the data to and/or reading the written data from the memory cell array 130. In an example embodiment, the test manager 110 may include a test mode register set (TMRS), and in response to the test mode command TM, the test manager 110 may output various signals included in the TMRS.

The additional word line driver 120 may receive an additional word line enable signal from the test manager 110, and may drive at least one additional word line based on the received signal. The additional word lines may indicate word lines driven to adjust the bit line capacitance. According to example embodiments of the present inventive concepts, at least one capacitor may be connected to the bit line as the additional word lines are driven, and thus, the bit line capacitance may be adjusted. As the bit line capacitance is adjusted, the memory cell array 130 having a cell-per-bit line different from a current cell-per-bit line of the memory cell array 130 may be mocked, and a test may be performed on the mocked memory cell array 130. Accordingly, even without actually manufacturing the memory cell array 130 having the tested design, a test may be performed on the memory cell array 130 having an adjusted cell-per-bit line. The additional word lines may include additional normal word lines which may write data and additional dummy word lines which are not used for writing data, and details thereof will be described in FIGS. 7A and 7B. The test word lines may indicate word lines that are connected to memory cells on which a test is performed in response to the test mode command TM.

The memory cell array 130 may include a plurality of memory cells to store data, and the plurality of memory cells may be classified into bank units. Details thereof will be described in FIGS. 4A and so on. Also, the memory cell array 130 includes a plurality of word lines, and a plurality of memory cells may be connected to each of the word lines. For example, memory cells connected to one same word line may be referred to as a row. Accordingly, the memory cell array 130 may include a plurality of rows.

The memory device 10 may be a semiconductor package including at least one memory chip, or may be a memory module in which a plurality of memory chips are formed on a module board. Also, although the memory device 10 and the memory controller 20 are described as being separately formed in FIG. 1, the memory device 10 may also be implemented as a memory system in which a memory control function and the memory cell array are integrated in a same semiconductor package.

Figure 2:
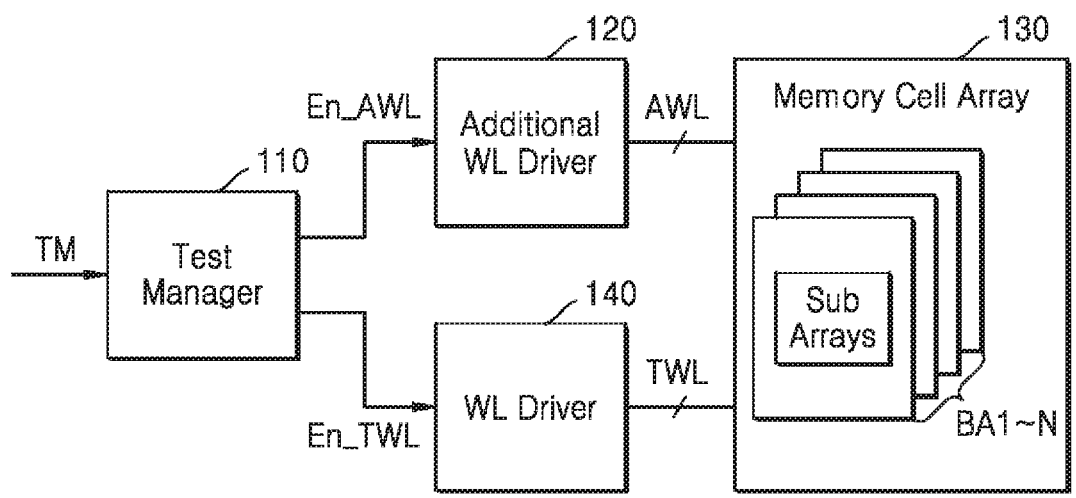
FIG. 2 is a block diagram of a memory device according to an example embodiment.

FIG. 2 is a block diagram of a memory device according to an example embodiment. Descriptions overlapping with those of FIG. 1 are omitted.

Referring to FIG. 2, the memory device 10 may include the test manager 110, the additional word line driver 120, the memory cell array 130 and a word line driver 140.

The test manager 110 may receive the test mode command TM, output an additional word line enable signal En_AWL to the additional word line driver 120 and output a test word line enable signal En_TWL to the word line driver 120, based on the received test mode command TM. In an example embodiment, the test mode command TM may include information regarding the number of the additional word lines AWL to be driven, and based on the test mode command TM, the test manager 110 may output the additional word line enable signal En_AWL to drive at least one additional word line AWL to the additional word line driver 120.

The additional word line driver 120 may drive the additional word lines AWLs based on the additional word line enable signal En_AWL. In an example embodiment, there may be a plurality of additional word lines AWLs, and the additional word line driver 120 may drive at least one of the plurality of additional word lines AWLs.

The word line driver 140 may drive test word lines TWLs based on the test word line enable signal En_TWL. Although the additional word line driver 120 and the word line driver 140 are illustrated as separate blocks in FIG. 2, it is merely an example, and the word line driver 140 and the additional word line driver 120, as a same word line driver, may drive the additional word lines AWLs and/or the test word lines TWLs.

The memory cell array 130 may include a plurality of banks BA1 through BAN including a plurality of sub-arrays. Each of the sub-arrays may be connected to a plurality of word lines, and the plurality of word lines may include additional word lines AWLs and test word lines TWLs. The sub array, which may indicate an array unit connected to a bit line sense amplifier, will be described hereinafter in FIG. 4A.

Figure 3:
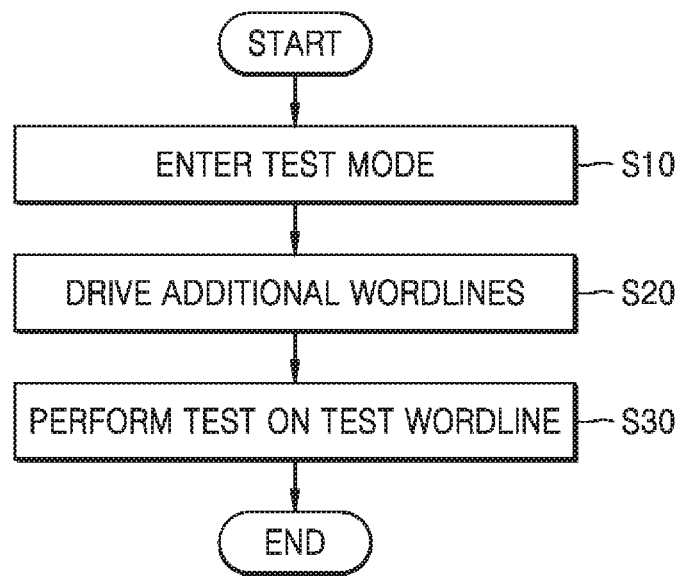
FIG. 3 is a flowchart of a method of operating the memory device according to an example embodiment.

FIG. 3 is a flowchart of a method of operating the memory device according to an example embodiment.

Referring to FIGS. 1 and 3, in operation S10, the memory device 10 may receive the test mode command TM from the memory controller 20 and enter a test mode to test a test word line. In operation S20, the memory device 10 may drive additional word lines to adjust a bit line capacitance. In operation S30, the memory device 10 may perform a test on the test word line.

In the memory device 10 according to example embodiments of the present inventive concepts, by driving the additional word lines, at least one capacitor connected to the additional word lines may be connected to the bit line, and by performing a test on the test word line, a test may be performed according to an adjusted cell-per-bit line.

Figure 4A:
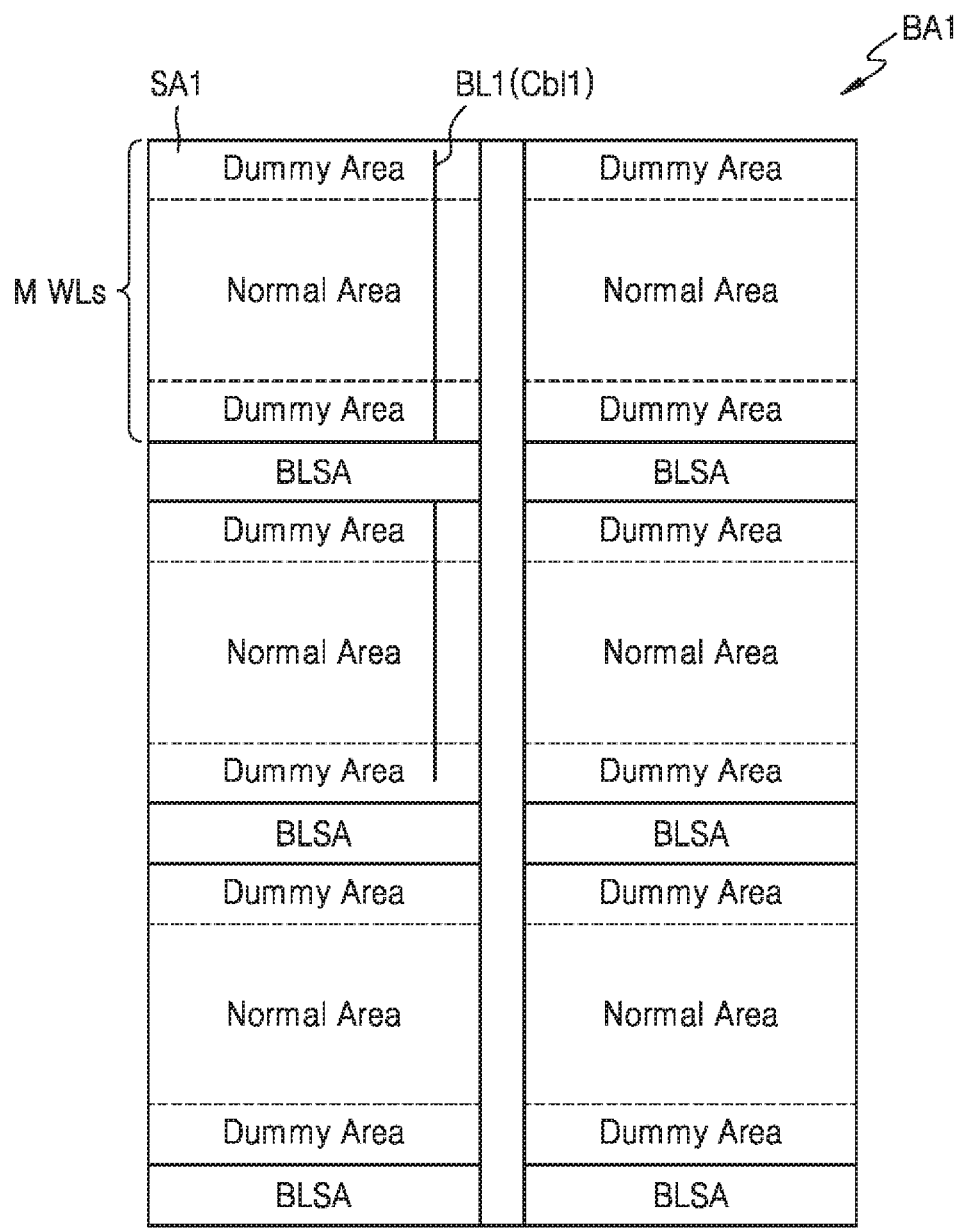
FIGS. 4A and 4B are diagrams respectively illustrating a memory cell array according to an example embodiment.
Figure 4B:
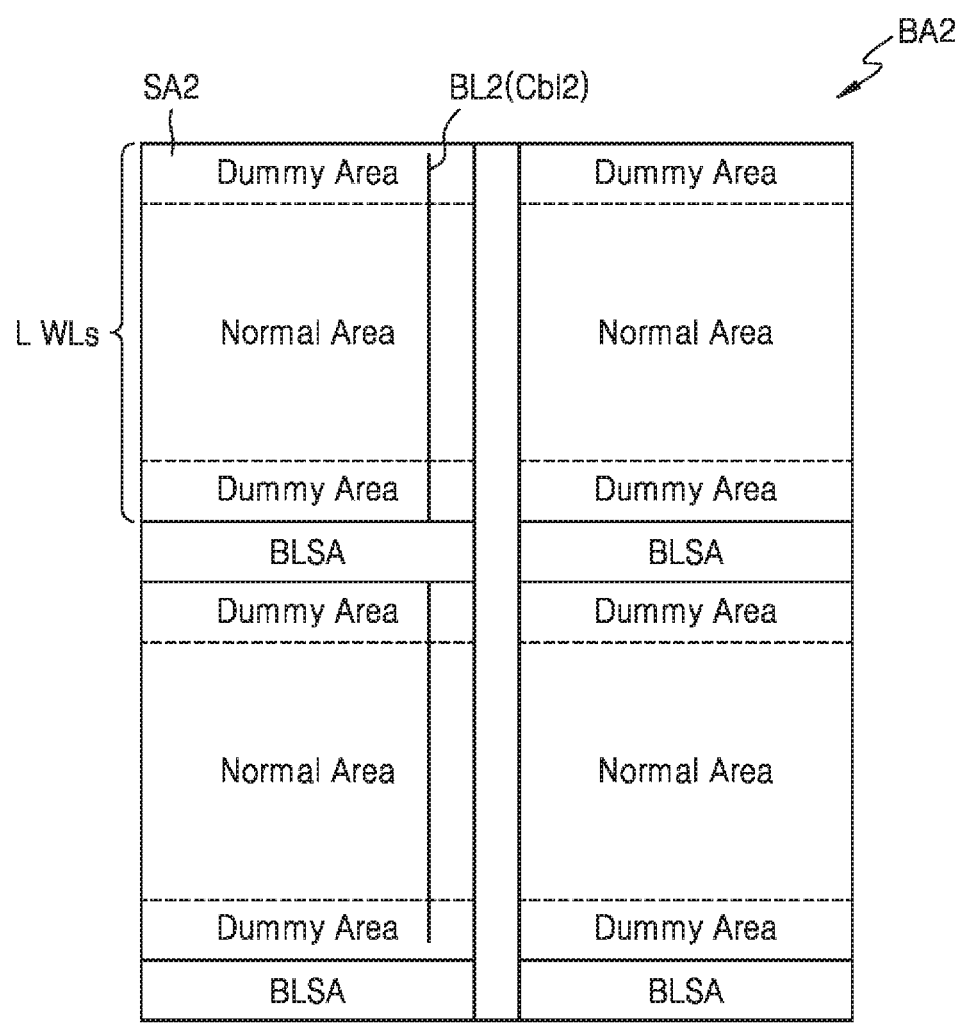

FIGS. 4A and 4B are diagrams respectively illustrating a memory cell array according to an example embodiment.

Referring to FIGS. 2 and 4A, a first bank BA1 included in the memory cell array 130 may include a plurality of sub-arrays including a first sub array SA1 and a plurality of bit line sense amplifiers BLSAs. Also, each of the sub-arrays may include a normal area including memory cells on which data is written and dummy areas including memory cells on which data is not written. As a classification unit of the memory cell array 130 which is connected to one bit line sense amplifier BLSA, the sub array may be connected to the BLSA through a plurality of bit lines. In FIG. 4A, an example embodiment is illustrated in which the first sub array SA1 is connected to a first bit line BL1. Although the example embodiment in which the one bit line BL1 is connected to the first sub array SA1 is illustrated, the first sub array SA1 may also be connected to the bit line sense amplifier BLSA through the plurality of bit lines.

Each of the sub-arrays including the first sub array SA1 may be connected with M word lines M WLs, where M is an integer equal to or greater than 1. The M word lines M WLs may include dummy word lines connected with memory cells in dummy areas and normal word lines connected with memory cells in the normal area. Also, the M word lines M WLs may include the test word lines to be tested and the additional word lines for adjusting capacitances of the bit lines, where the additional word lines may include one or more of the normal word lines and the dummy word lines.

The first bit line BL1 may have a first bit line capacitance Cb11 due to a uniqueness of the first bit line BL1 (for example, a parasitic capacitance), and the first bit line capacitance Cb11 may be determined according to the number of word lines corresponding to length of the bit line.

Referring to FIG. 4B, a second bank BA2 included in the memory cell array 130 may include a plurality of sub-arrays including a second sub array SA2 and a plurality of bit line sense amplifiers BLSAs. Like the first sub array SA1 in FIG. 4A, the second sub array SA2 may also include a normal area including memory cells on which data is written and dummy areas including memory cells on which data is not written.

Unlike the first sub array SA1 in FIG. 4A, each of the plurality of sub-arrays including the second sub array SA2 may be connected to L word lines L WLs, where L is an integer equal to or greater than 1 and L may be a different integer from M. For example, according to an example embodiment, L may be an integer greater than M such that the second sub array SA2 is bigger than the first sub array SA1.

To reduce size of the memory cell array 130 without changing a storage capacity, a size of the banks BA may be reduced. For example, by increasing the number of word lines and reducing the number of the bit line sense amplifiers BLSAs corresponding to one bit line, it is possible to reduce the size of the banks BA without changing the storage capacity of the memory cell array 130. However, as the second sub array SA2 is bigger than the first sub array SA1, a second bit line BL2 connected to the second sub array SA2 may have a second bit line capacitance Cb12 that is different from the first bit line capacitance Cb11 of the first bit line BL1 connected to the first sub array SA1. Also, in an example embodiment, the second bit line BL2, which is longer than the first bit line BL1, may have a larger capacitance than the capacitance of the first bit line BL1. Due to a gap between the bit line capacitances, a test result with respect to the first sub array SA1 may not be effective to the second sub array SA2.

According to example embodiments of the present inventive concepts, by driving the additional word lines which may be part of the M word lines M WLs included in the first sub array SA1, capacitances of the memory cells connected to the additional word lines may be added to the first bit line capacitance Cb11, and accordingly, the first bit line BL1 may be controlled to have a capacitance equal to the second bit line capacitance Cb12 of the second sub array SA2. Consequently, the memory device 10 according to an example embodiment may use the first sub array SA1 to mock the second sub array SA2 having a size different from a size of the first sub array SA1, and may use the first sub array SA1 to perform a test on the second sub array SA2.

Although an example embodiment in which the first bank BA1 includes 2×3 sub-arrays is illustrated in FIG. 4A, the first bank BA1 may include more or less sub-arrays. Also, although an example embodiment in which the second bank BA2 includes 2×2 sub-arrays is illustrated in FIG. 4B, the second bank BA2 may include more or less sub-arrays.

Figure 5:
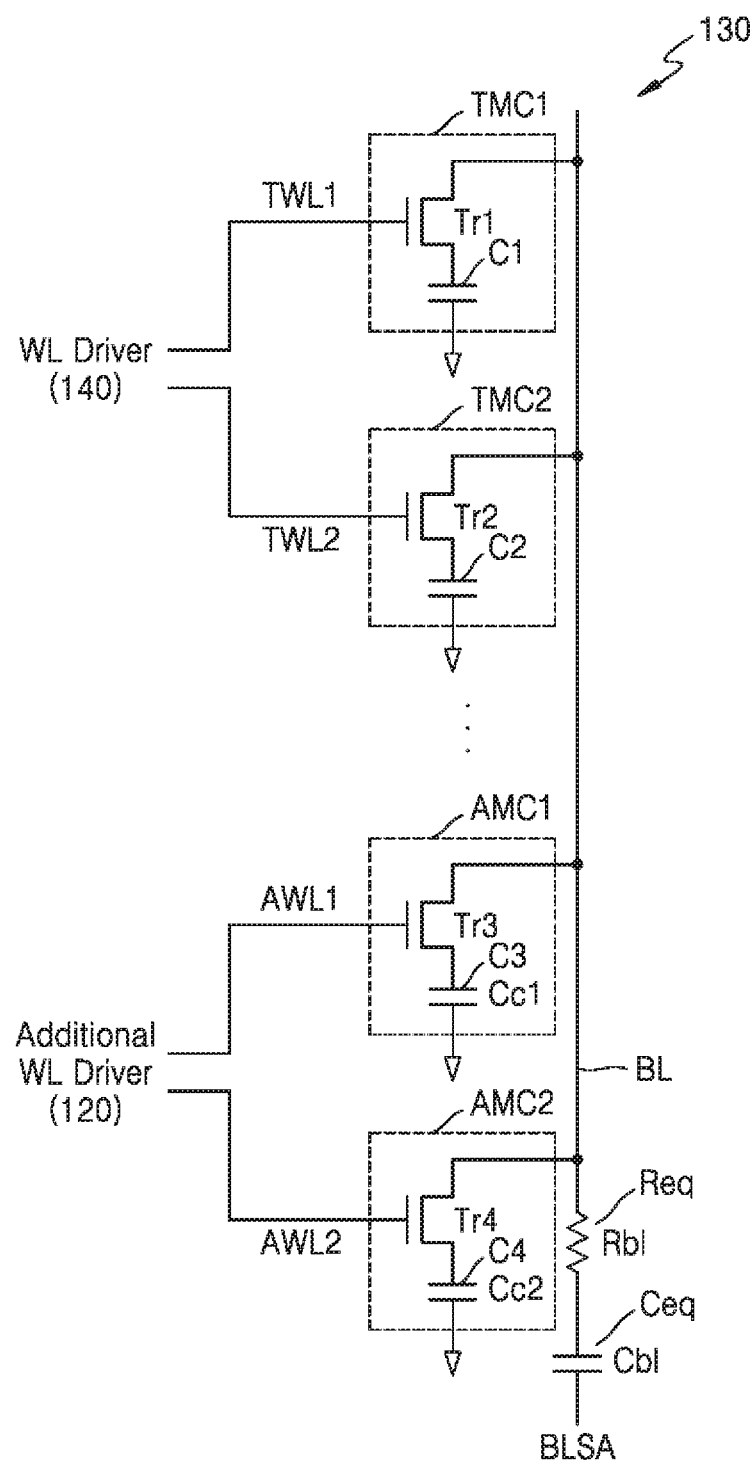
FIG. 5 is a circuit diagram illustrating operations of the memory cell array according to an example embodiment.

FIG. 5 is a circuit diagram illustrating operations of the memory cell arrays according to an example embodiment. More particularly, FIG. 5 is a circuit diagram of memory cells connected to one of the bit lines in the sub-arrays included in the memory cell array.

Referring to FIGS. 2 and 5, the memory cell array 130 may include a first test memory cell TMC1, a second test memory cell TMC2, a first additional memory cell AMC1 and a second additional memory cell AMC2. The first memory cells TMC1 and the second test memory cell TMC2 may be memory cells to be tested, and the first additional memory cell AMC1 and the second additional memory cell AMC2 may be memory cells connected to the additional word lines AWL1 and AWL2.

Each of the first test memory cell TMC1, the second test memory cell TMC2, the first additional memory cell AMC1, and the second additional memory cell AMC2 may include a transistor and a capacitor. A first test word line TWL1, a bit line BL, a first capacitor C1 may respectively be connected to a gate, a first end, and a second end of a first transistor Tr1 included in the first test memory cell TMC1. Also, a second test word line TWL2, the bit line BL, a second capacitor C2 may respectively be connected to a gate, a first end, and a second end of a second transistor Tr2 included in the second test memory cell TMC2.

A first additional word line AWL1, the bit line BL, a capacitor C3 having a first cell capacitance Cc1 may respectively be connected to a gate, a first end, and a second end of a third transistor Tr3 included in the first additional memory cell AMC1. A second additional word line AWL2, the bit line BL, a fourth capacitor C4 having a second cell capacitance Cc2 may respectively be connected to a gate, a first end, and a second end of a fourth transistor Tr4 included in the second additional memory cell AMC2.

The bit line BL may be connected to the bit line sense amplifier BLSA. In the bit line BL, an equivalent resistance Req may have a bit line resistance Rb1, and an equivalent capacitor Ceq may have a bit line capacitance Cb1. Also, the bit line capacitance Cb1 may be proportional to the cell-per-bit line, which is a ratio of the memory cells connected to one bit line. In other words, as the number of the memory cells (or word lines corresponding thereto) being connected to one bit line increases, the bit line capacitance Cb1 may also increase. Accordingly, as size of the sub-arrays increases in a direction of the bit line, the bit line capacitance Cb1 may also increase.

When the test mode command TM is input to the memory device 10, the test manager 110 may control the additional word line driver 120, thereby driving at least one of the first additional word line AWL1 and the second additional word line AWL2. Accordingly, as at least one of the third capacitor C3 and the fourth capacitor C4 is connected to the bit line BL, and the equivalent capacitor Ceq of the bit line BL, the third capacitor C3, and the fourth capacitor C4 are connected in parallel, and thus, the capacitance may simply be a sum of the bit line capacitance Cb1, the first cell capacitance Cc1, and the second cell capacitance Cc2.

In an example embodiment, when the first additional word line AWL1 is driven, as the third capacitor C3 is connected to the bit line BL, a bit line capacitance that is mocked may be a sum Cb1+Cc1 of the bit line capacitance Cb1 and the first cell capacitance Cc1. In another example embodiment, when the first additional word line AWL1 and the second word line AWL2 are driven, as the third capacitor C3 and the fourth capacitor C4 are connected to the bit line BL, a bit line capacitance that is mocked may be a sum Cb1+Cc1+Cc2 of the bit line capacitance Cb1, the first cell capacitance Cc1, and the second cell capacitance Cc2, respectively.

The memory device 10 may add the cell capacitances Cc1 and Cc2 to the bit line capacitance Cb1 by driving the additional word lines AWL1 and AWL2, and may drive the test word lines TWL1 and TWL2 by controlling the word line driver 140, thereby performing a test on the test memory cells TMC1 and TMC2.

Although an example embodiment in which two additional word lines AWL1 and AWL2 are used is described in FIG. 5, example embodiments of the present inventive concepts are not limited thereto, and the number of the additional word lines AWL1 and AWL2 may be more or less than 2. Also, although there are two test word lines TWL1 and TWL2 in the example embodiment illustrated in FIG. 5, example embodiments of the present inventive concepts are not limited thereto, and the number of the test word lines TWL1 and TWL2 may be more or less than 2.

Figure 6:
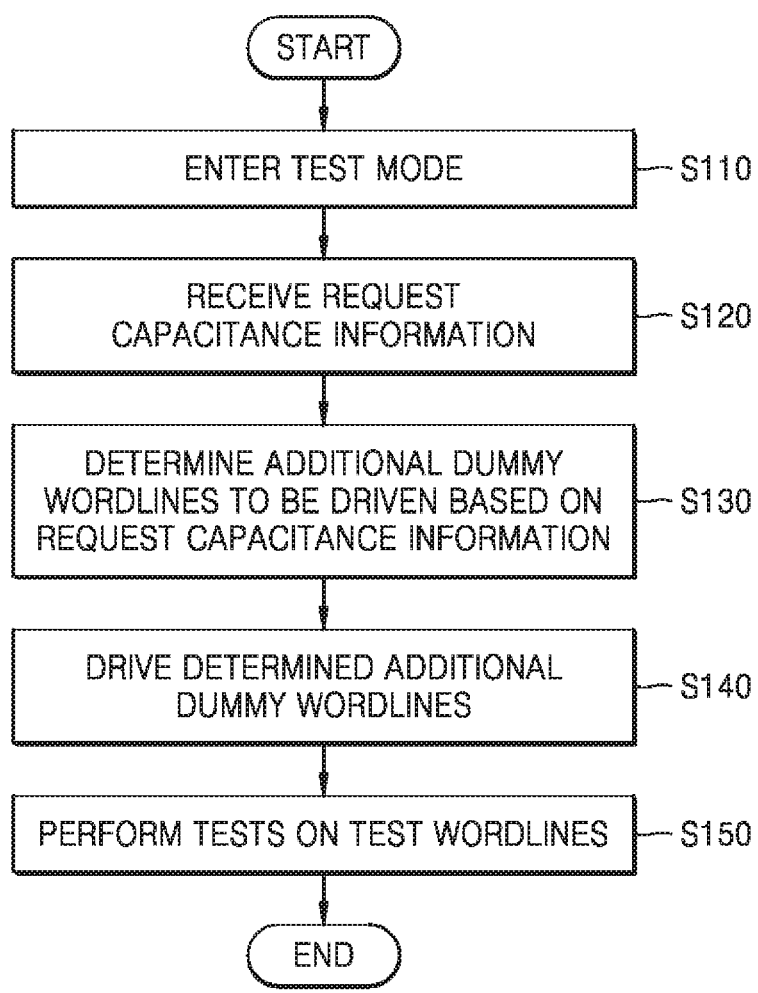
FIG. 6 is a flowchart of a method of operating the memory device according to an example embodiment.

FIG. 6 is a flowchart of a method of operating the memory device according to an example embodiment. More particularly, FIG. 6 is a flowchart of an example embodiment in which the memory device uses additional dummy word lines as the additional word lines.

Referring to FIGS. 2 and 6, in operation S110, the test manager 110 may receive the test mode command TM from the memory controller 20 and enter the test mode. In operation S120, the test manager 110 may receive request capacitance information. While FIG. 6 illustrates the request capacitance information being received in a separate operation from the receipt of the test mode command TM, example embodiments are not limited thereto. For example, in an example embodiment, the request capacitance information may be included in the test mode command TM, and the test manager 110 may acquire the request capacitance information from the test mode command TM. The request capacitance information may include information regarding a bit line capacitance to be mocked. In some example embodiments, the request capacitance information may be a target capacitance, and in other example embodiments, the request capacitance information may be a target cell-per-bit line.

In operation S130, the test manager 110 may determine additional dummy word lines to be driven, based on the request capacitance information. In the example embodiment where the request capacitance information is the target capacitance, the test manager 110 may determine additional dummy word lines to be driven, by using a gap (or, alternatively, a difference) between the target capacitance and a current bit line capacitance. In the example embodiment where the request capacitance information is the target cell-per-bit line, the test manager 110 may determine additional dummy word lines to be driven, by using a gap (or, alternatively, a difference) between the target cell-per-bit line and the current cell-per-bit line.

In operation S140, the test manager 110 may drive the determined additional dummy word lines, by outputting the additional word line enable signal En_AWL to the additional word line driver 120. Accordingly, as at least one capacitor connected to the additional dummy word lines is connected to the bit line, the target capacitance or the target cell-per-bit line may be mocked.

In operation S150, the test manager 110 may perform a test on the memory cell that has been mocked, by outputting a test word line enable signal En_TWL to the word line driver.

Figure 7A:
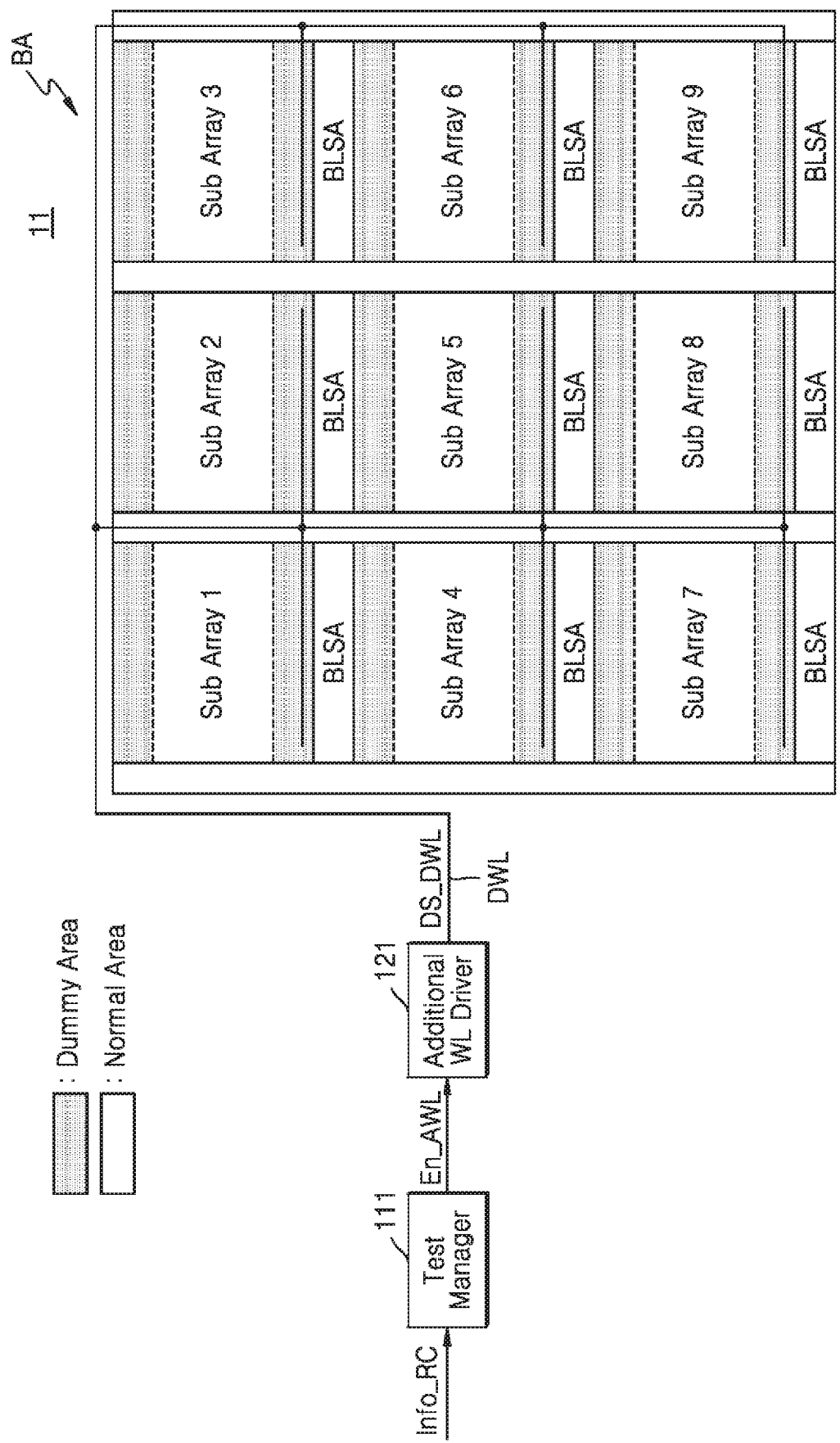
FIG. 7A is a diagram of operations of a memory device according to an example embodiment.

FIG. 7A is a diagram of operations of a memory device according to an example embodiment. More particularly, FIG. 7A is a diagram of an example embodiment in which an additional word line driver 121 increases a bit line capacitance by driving additional dummy word lines.

Referring to FIGS. 2 and 7A, a memory device 11 may include a test manager 111, an additional word line driver 121, and a bank BA including a plurality of sub-arrays.

The additional word line driver 121 may receive an additional word line enable signal En_AWL from the test manager 111, and may drive additional dummy word lines DWLs connected to the additional word line driver, in response to the received signal. The additional dummy word lines DWLs may be included in shaded dummy areas. In the example embodiment of FIG. 7A, the bank BA may include first through ninth sub-arrays, and each of the sub-arrays may be connected to one of the additional dummy word lines DWLs. The additional word line driver 121 may output a dummy word line drive signal DS_DWL to the dummy word lines DWLs connected to the first through ninth sub-arrays, and thus, the additional dummy word lines DWLs may be driven. Accordingly, capacitors of dummy memory cells connected to the additional dummy word lines DWLs may be connected to each of the bit lines, and the bit line capacitances may increase.

Figure 7B:
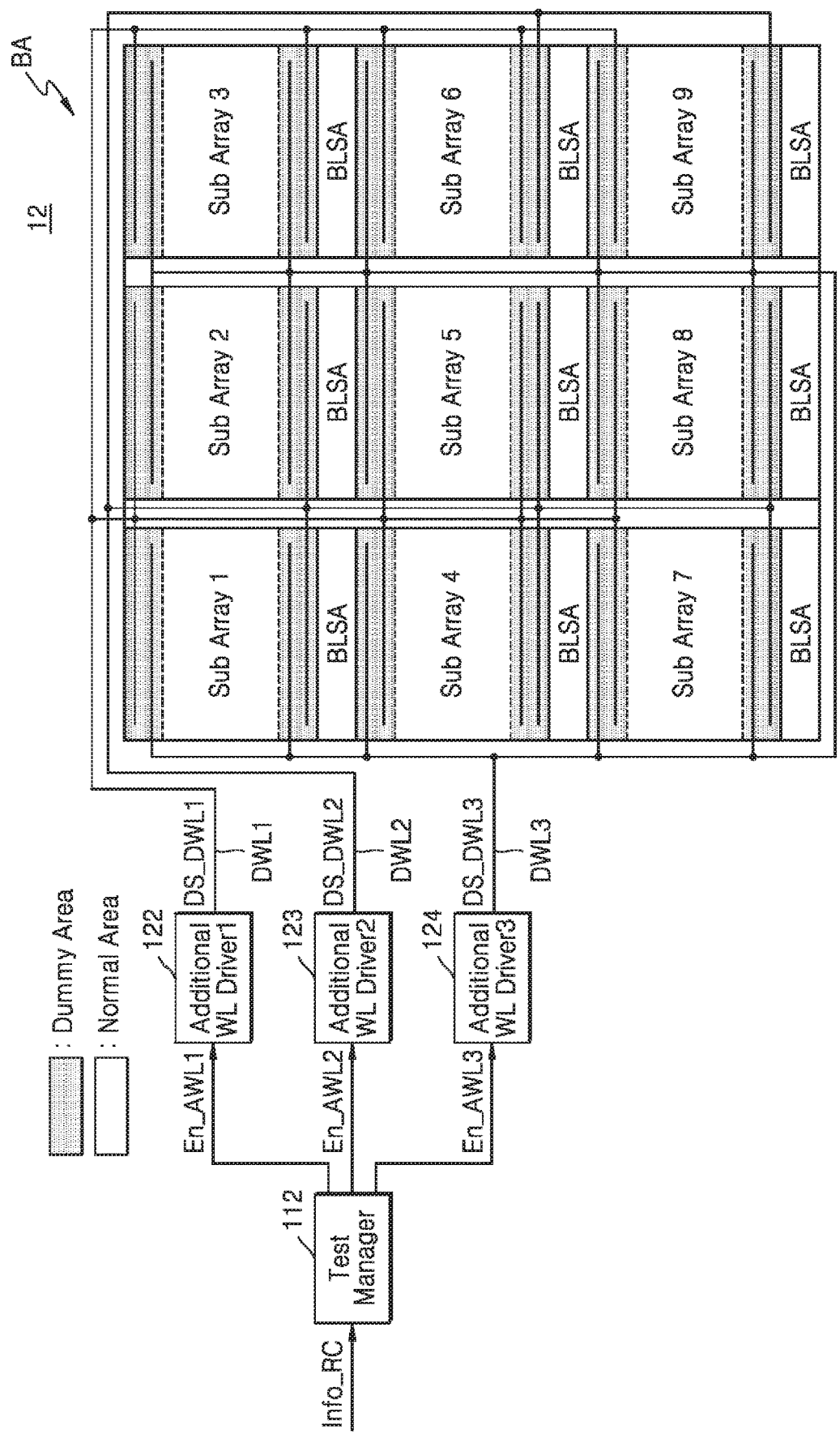
FIG. 7B is a diagram of operations of a memory device according to an example embodiment.

FIG. 7B is a diagram of operations of a memory device according to an example embodiment. More particularly, FIG. 7B is a diagram of an example embodiment in which a plurality of additional word line drivers increase bit line capacitances by driving additional dummy word lines.

Referring to FIGS. 2 and 7B, a memory device 12 may include test manager 112, the plurality of additional word line drivers including first through third additional word line drivers 122 through 124, and the bank BA, where the bank BA may include the first through ninth sub-arrays. Each of the first through ninth sub-arrays may be connected with at least one of the first through third additional dummy word lines DWL1 through DWL3. The first through third additional dummy word lines DWL1 through DWL3 may be included in shaded dummy areas.

The first additional word line driver 122 may receive a first additional word line enable signal En_AWL1 from the test manager, and may drive the first additional dummy word lines DWL1 connected to the first additional word line driver 122, in response to the received enable signal. Each of the first through third sub-arrays may be connected to one first additional dummy word line DWL1, each of the fourth through sixth sub-arrays may be connected to two first additional dummy word lines DWLs, and each of the seventh through ninth sub-arrays may be connected to one first additional dummy word line DWL1.

The second additional word line driver 123 may receive a second additional word line enable signal En_AWL2 from the test manager 112, and may drive the second additional dummy word lines DWL2 connected to the second additional word line driver 123, in response to the received signal. Each of the first through ninth sub-arrays may be connected to one second additional dummy word line DWL2.

The third additional word line driver 124 may receive a third additional word line enable signal En_AWL3 from the test manager 112, and may drive the third additional word lines DWL3 connected to the third additional word line driver 124, in response to the received signal. Each of the first through third sub-arrays may be connected to two third additional dummy word lines DWL3, each of the fourth through sixth sub-arrays may be connected to one third additional dummy word line DWL3, and each of the seventh through ninth sub-arrays may be connected to two third additional dummy word lines DWL3.

The test manager 110 may determine additional dummy word lines DWL1 through DWL3 to be driven based on request capacitance information Info_RC included in the test mode command TM, and may output at least one of first through third additional word line enable signals En_AWL1 through En_AWL3 based on the determination.

In an example embodiment where three additional dummy word lines DWL1 through DWL3 are determined to be driven for each of the first through ninth sub-arrays, the first additional dummy word lines DWL1 and the third additional dummy word lines DWL3 may be driven, and the test manager 112 may output the first additional word line enable signal En_AWL1 to the first additional word line driver 122, and the third additional word line enable signal En_AWL3 to the third additional word line driver 124. By forming various combinations of the additional dummy word lines DWL1 through DWL3 driven in response to the request capacitance information Info_RC, the test manager 112 may mock a required cell-per-bit line.

Although an example embodiment in which three additional dummy word lines DWL1 through DWL3 are used is illustrated in FIG. 7B, it is merely an example, and example embodiments of the present inventive concepts also may be applied to example embodiments in which more or less additional dummy word lines are used. Also, the additional dummy word lines DWL1 through DWL3 may variously be connected to the first through ninth sub-arrays besides connections described in FIG. 7B. Although an example embodiment in which the cell-per-bit line is variously mocked by using the additional dummy word lines DWL1 through DWL3 is described in FIG. 7B, example embodiments of the present inventive concepts may also be applied to an example embodiment in which the cell-per-bit line is variously mocked by using combinations of the additional normal word lines stated above.

Figure 8:
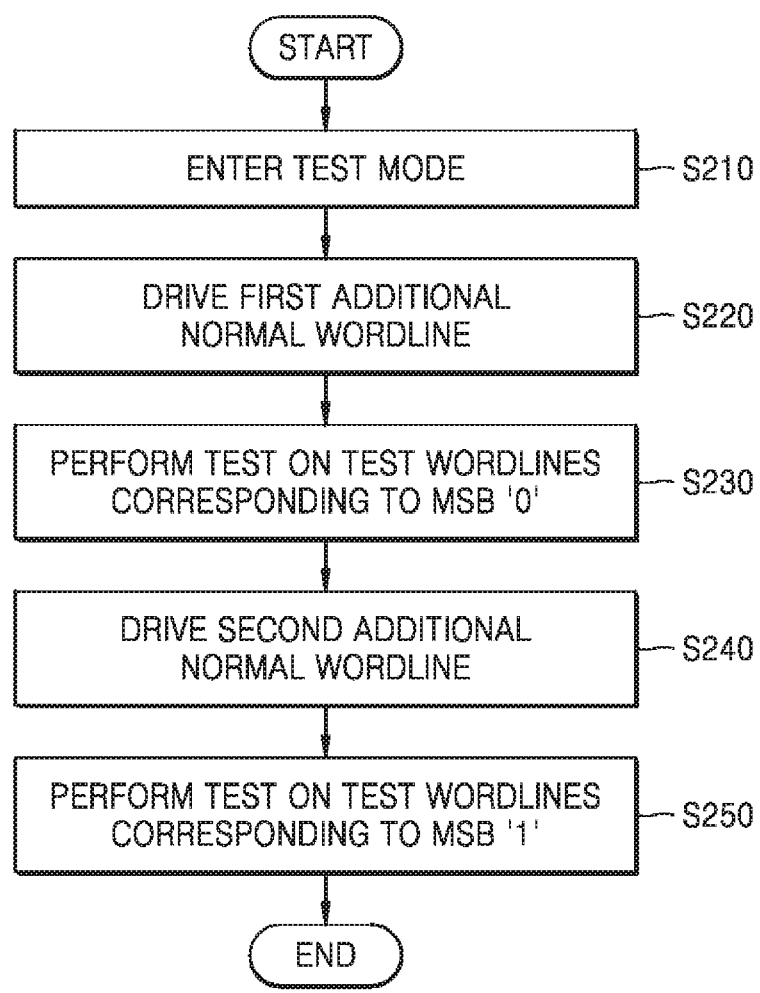
FIG. 8 is a flowchart of a method of operating the memory device according to an example embodiment.

FIG. 8 is a flowchart of a method of operating the memory device according to an example embodiment. More particularly, FIG. 8 is a flowchart of an example embodiment in which the memory device uses additional normal word lines as additional word lines.

Referring to FIGS. 2 and 8, in operation S210, the test manager 110 may enter the test mode in response to receiving of the test mode command TM.

In operation S220, the test manager 110 may drive the first additional word line driver connected to a first additional normal word line. In an example embodiment, the first additional normal word line may be a word line having '1' as a most significant bit (MSB) of an address in the sub-arrays under a normal mode. Also, in an example embodiment, the normal word lines may be word lines placed in the normal area and used for writing data, and in another example embodiment, the normal word lines may be replacement normal word lines placed in the normal area and used for repairing damaged ones of the word lines used for writing the data.

After the bit line capacitance has increased by driving the first additional normal word line, in operation S230, the test manager 110 may perform a test on a test word line TWL, by outputting a test word line enable signal En_TWL to the word line driver 140 corresponding to a test word line TWL having '0' as an MSB. In an example embodiment, the test word line TWL on which the test is performed in operation S230 may be connected to a memory cell having '0' as the MSB of the address.

After the test on the test word line TWL connected to the memory cell having '0' as the MSB is completed, in operation S240, the test manager 110 may drive the second additional word line driver connected to the second additional normal word line. In an example embodiment, the second normal word line may be a normal word line having '0' as an MSB of the address under the normal mode.

After the bit line capacitance has increased by driving the second additional normal word line, in operation S250, the test manager 110 may perform a test on a test word line TWL, by outputting a test word line enable signal En_TWL to the word line driver 140 corresponding to a test word line TWL having '1' as an MSB. In an example embodiment, the test word line TWL on which the test is performed in operation S250 may be connected to a memory cell having '1' as MSB of the address.

According to example embodiments of the present inventive concepts, by performing a test on a test word line TWL having a different MSB from the MSB of the first additional normal word line, and when the test is finished, by sequentially performing tests on a test word line having an MSB different from the MSB of the second additional normal word line, tests on the test word lines TWLs may be actively performed even while the additional normal word line AWL is being driven.

Although an example embodiment of performing a test on the test word line TWL having '1' as the MSB after performing a test on the test word line TWL having '0' as the MSB is illustrated in FIG. 8, it is merely an example, and example embodiments of the present inventive concepts may also be applied to other example embodiments in which the word lines are distinguished in various ways. For example, in some example embodiments, a test may be performed on the test word line TWL having '0' as an MSB after performing a test on the test word line having '1' has the MSB.

Figure 9:
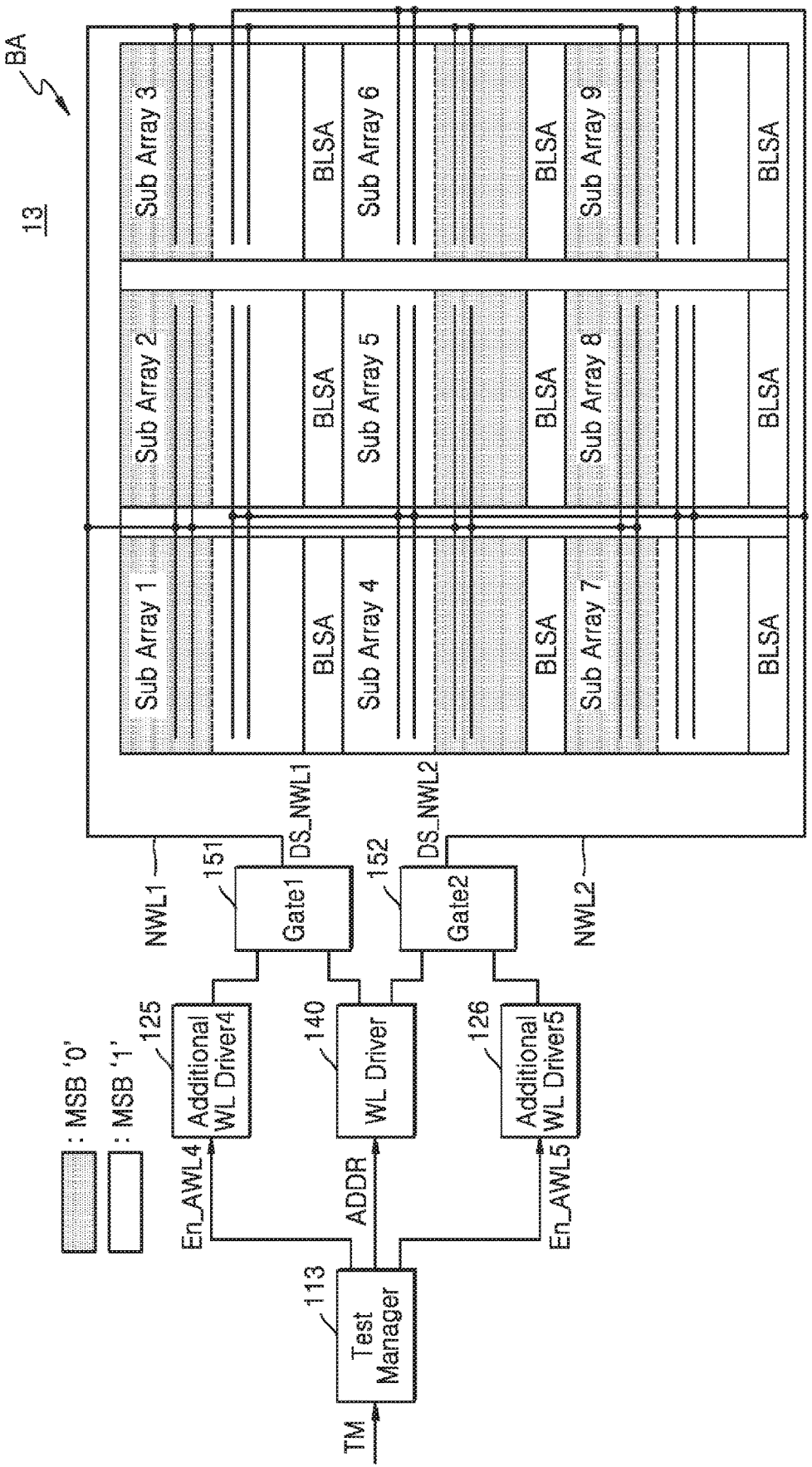
FIG. 9 is a diagram of operations of a memory device according to an example embodiment.

FIG. 9 is a diagram of operations of a memory device according to an example embodiment. More particularly, FIG. 9 is a diagram of an example embodiment in which a plurality of additional word line drivers 125 and 126 increase bit line capacitance by driving additional normal word lines.

Referring to FIGS. 2 and 9, the memory device 13 may include a test manager 113, fourth and fifth additional word line drivers 125 and 126, first and second gates 151 and 152, and a bank BA. The bank BA may include first through ninth sub-arrays. Each of the first through ninth sub-arrays may be connected to at least one of the first and second additional normal word lines NW1 and NWL2. In an example embodiment, the first additional normal word line NWL1 may be connected to a sub array area having '0' as an MSB, and the second additional word line NWL2 may be connected to a sub array area having '1' as an MSB.

The test manager 113 may determine the additional normal word lines NWL1 and NWL2 to be driven, based on the test mode command TM, and may output at least one of fourth and fifth additional word line enable signals En_AWL4 and En_AWL5 based on the determination. In an example embodiment, in an operation of performing a test on a memory cell having '0' as an MSB of the address ADDR, the test manager 113 may output the fifth additional word line enable signal En_AWL5, and in an operation where a test is performed on a memory cell having '1' as an MSB of the address ADDR, the test manager 113 may output the fourth additional word line enable signal En_AWL4. By sequentially driving the additional normal word lines NWL1 and NWL2, the test manager 113 may mock a required cell-per-bit line by using the normal word lines instead of dummy word lines.

The fourth additional word line driver 125 may receive the fourth additional word line enable signal En_AWL4 from the test manager 113, and in response to the received signal, may drive the first additional normal word line NWL1 connected to the fourth additional normal word line driver 125. Also, the first gate 151 may perform switching to have one of the fourth additional word line driver 125 or the word line driver 140 drive the first additional normal word line NWL1. When the fourth additional word line driver 125 outputs a signal to drive the first additional normal word line NWL1 to the first gate 151 in response to the received fourth additional word line enable signal En_AWL4, the first gate 151 may output a first normal word line driving signal DS_NWL1 to the first additional normal word line NWL1 in response to the output from the fourth additional word line driver 125. For the output operation, in an example embodiment, the first gate 151 may include at least one OR gate.

As the first additional normal word line NWL1 is driven, capacitors of the memory cells are connected to the bit line, and the bit line capacitance may increase. Consequently, when the memory cell is mocked like a memory cell having a high cell-per-bit line, the test manager 113 may output an address ADDR of the test word line TWL to be tested to the word line driver 140. According to an example embodiment, an MSB of the address may be '1', which is different from the MSB of the first additional normal word line NWL1. And the word line driver 140 may perform a test word line TWL having '1' as the MSB, by driving the test word line TWL in response to the MSB of the address ADDR.

In an example embodiment, the word line driver 140 may output a signal to drive the second additional normal word line NWL2 to a second gate 152 to perform a test on the second additional normal word lines NWL2, and in response to the output from the word line driver, the second gate 152 may output a second normal word line driving signal DS_NWL2 to the second additional normal word line NWL2. Accordingly, a test may be performed on the second normal word line NWL2.

The fifth additional word line driver 126 may receive a fifth additional word line enable signal En_AWL5 from the test manager 113, and in response to the received signal, may drive the second additional normal word line NWL2 connected to the fifth additional word line driver 126. Also, the second gate 152 may perform switching to have one of the fifth additional word line driver 126 or the word line driver 143 drive the second additional normal word line NWL2. When the fifth additional word line driver 126 outputs a signal to drive the second additional normal word line NWL2 to the second gate 152 in response to the received fifth additional word line enable signal En_AWL5, the second gate 152 may output a second normal word line driving signal DS_NWL2 to the second additional normal word line NWL2 in response to the output from the fifth additional word line driver 126. For the output operation, in an example embodiment, the second gate 152 may include at least one OR gate.

As the second additional normal word line NWL2 is driven, the capacitors of the memory cells may be connected to the bit line, and the bit line capacitance may increase. Consequently, when the memory cell is mocked like a memory cell having a high cell-per-bit line, the test manager 113 may output an address ADDR of the test word line TWL to be tested to the word line driver 140. According to an example embodiment, an MSB of the address ADDR may be '0', which is different from the MSB of the second additional normal word line NWL2. The word line driver 140, by driving the test word line TWL in response to the MSB of the address ADDR, may perform a test on the test word line TWL having '0' as an MSB.

In an example embodiment, in order to perform a test on the first additional normal word line NWL1, the word line driver 140 may output a signal to drive the first additional normal word line NWL1 to the first gate 151, and the first gate 151 may output a first normal word line driving signal DS_NWL1 to the first additional normal word line NWL1 in response to the output from the word line driver 140. Accordingly, a test may be performed with respect to the first additional normal word line NWL1.

As described above, by sequentially driving the additional normal word lines NWL1 and NWL2 according to MSBs, and performing a test on the test word line TWL having the MSB different from the MSBs of the driven additional normal word lines NWL1 and NWL2, a required cell-per-bit line may be mocked by using the normal word lines instead of the dummy word lines.

Although FIG. 9 shows an example embodiment in which the two additional normal word lines NWL1 and NWL2 are connected to each of the sub-arrays, it is merely an example, and example embodiments of the present inventive concepts may also be applied when the number of the sub-arrays is more or less than 2. Also, the additional normal word lines NWL1 and NWL2 may be variously connected to the first through ninth sub-arrays besides connections described in FIG. 9.

Figure 10:
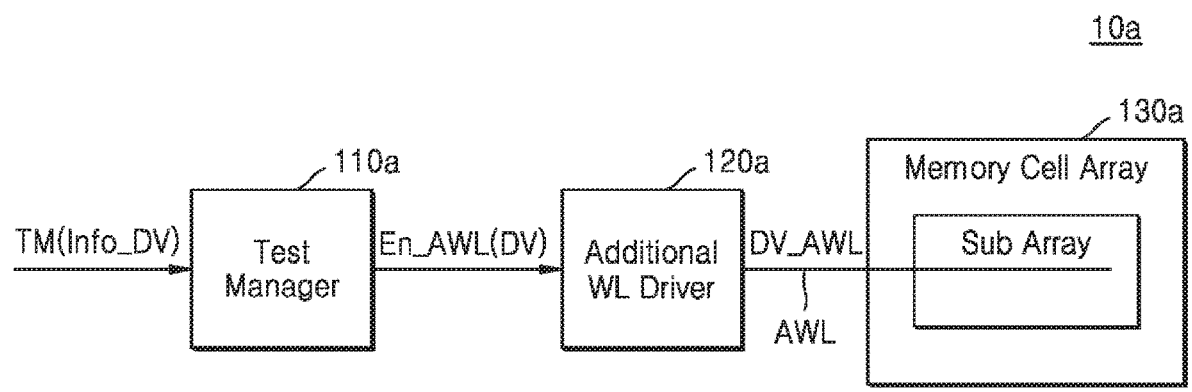
FIG. 10 is a block diagram of a memory device according to an example embodiment.

FIG. 10 is a block diagram of a memory device according to an example embodiment. Descriptions overlapping with those of FIG. 2 are omitted.

Referring to FIG. 10, a memory device 10*a* may include a test manager 110*a*, an additional word line driver 120*a* and a memory cell array 130*a*, and additional word lines AWLs connected to the additional word line driver 120*a* may be connected to a sub array 131*a* included in the memory cell array 130*a*.

The test manager 110*a* may receive a test mode command TM including driving voltage information Info_DV from outside (for example, the memory controller 20 in FIG. 1). The test manager 110*a* may determine a driving voltage DV based on the driving voltage information Info_DV, and may output an additional word line enable signal En_AWL to the additional word line driver 120*a* according to the determined driving voltage DV. The additional word line driver 120*a* may apply an additional word line driving voltage DV_AWL to the additional word lines AWLs to correspond to the determined driving voltage DV in response to the output from the test manager 110*a*.

According to an example embodiment, by variously setting the additional word line driving voltage DV_AWL, it is possible to control connections between the capacitors included in the memory cells connected to the additional word lines AWLs and the bit line. In other words, by elaborately adjusting the additional word line driving voltage DV_AWL, the bit line capacitance may be elaborately adjusted. In an example embodiment, the bit line capacitance may be proportional to the additional word line driving voltage DV_AWL.

Figure 11:
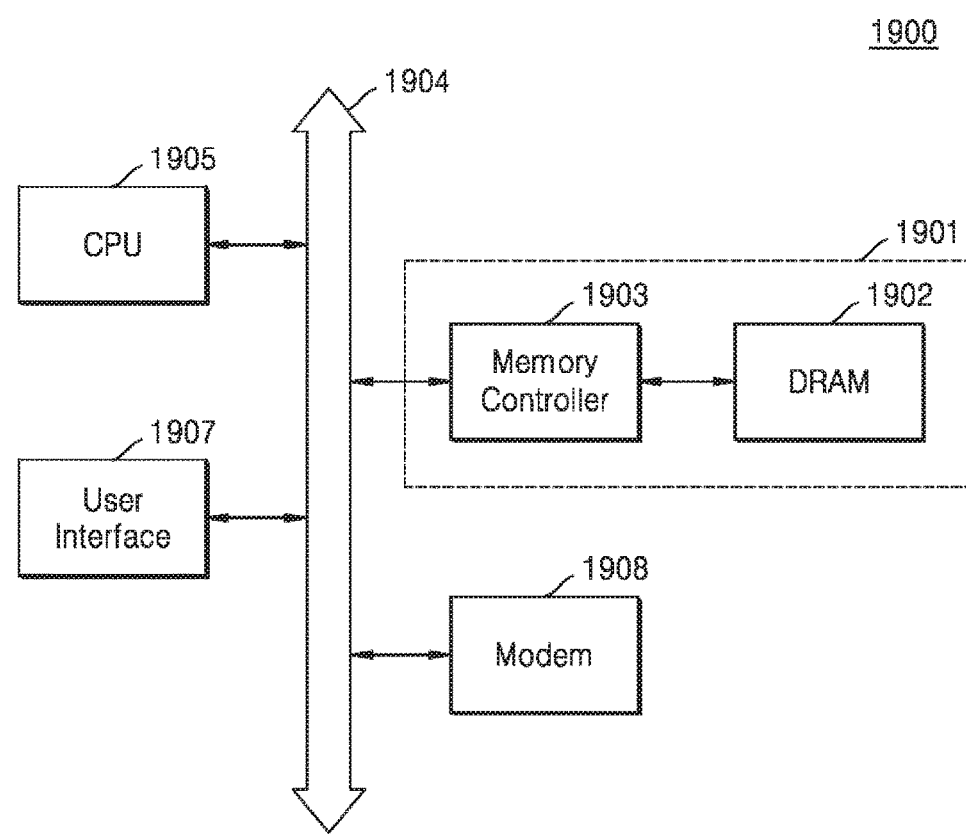
FIG. 11 is a block diagram of a computer system according to an example embodiment.

FIG. 11 is a block diagram of a computer system according to an example embodiment.

Referring to FIG. 11, a computer system 1900 may be placed in mobile devices or desk top computers. The computer system 1900 may include a DRAM memory system 1901, a central processing unit (CPU) 1905, a user interface 1907, and a modem 1908 such as baseband chipset, which are electrically connected to a system bus 1904. The computer system 1900 may further include an application chipset, a camera image processor (CIS), an input/output device, and the like.

The user interface 1907 may be an interface to send data to or receive data from communication networks. The user interface 1907 may be a wired type and/or a wireless type, and may include an antenna and/or a wired/wireless transceiver, and the like. Data provided via the user interface 1907 or the modem 1908, or processed by the CPU 1905 may be stored in the DRAM memory system 1901.

The DRAM memory system 1901 may include the memory system 1 described in detail in FIGS. 1 through 10. The DRAM memory system 1901 may include a DRAM 1902 and a memory controller 1903. Data processed by the CPU 1905 or input from outside is stored in the DRAM 1902. When receiving the test mode command from the memory controller 1903, the DRAM 1902 may mock a memory cell array with a high cell-per-bit line by driving at least one of the additional word lines, and may perform a test on the mocked memory cell array.

When the computer system 1900 is an apparatus performing wireless communication, the computer system 1900 may be used in communication systems such as code division multiple access (CDMA), global system for mobile communication (GSM), North American multiple access (NADC), and CDMA2000. The computer system 1900 may be arranged on data processing devices such as personal digital assistant (PDA), portable computer, web tablet, digital camera, portable media player (PMP), mobile phone, wireless phone, and laptop computer.

While example embodiments of the inventive concepts have been particularly shown and described with reference to some example embodiments thereof, it will be understood that various changes in form and details may be made therein without departing from the spirit and the scope of the following claims.

What is claimed is:

1. A memory device, comprising:
    a memory cell array connected to a bit line, first word lines, and second word lines, the memory cell array including a first memory cell and second memory cells, the first memory cell being connected between one of the first word lines and the bit line, and the second memory cells being connected between a respective one of the second word lines and the bit line;
    a first word line driver configured to drive the first word lines;
    a second word line driver configured to drive the second word lines; and
    a test manager configured to,
        control the second word line driver in a test mode to drive N second word lines of the second word lines to change a capacitance of the bit line by connecting a cell capacitor included in each of the second memory cells associated with the N second word lines to the bit line connected to the first memory cell such that the capacitance of the bit line connected to the first memory cell increases, N being an integer greater than or equal to one, and
        control, after the capacitance of the bit line connected to the first memory cell is changed, the first word line driver such that the first word lines are driven to test the first word lines.

2. The memory device of claim 1, wherein
the memory device is configured to test the first memory cell, and to not to test the second memory cells.

3. The memory device of claim 1, wherein the second word lines comprise:
dummy word lines that are not used for writing data to the memory cell array.

4. The memory device of claim 3, wherein
the second word lines include X first dummy word lines and Y second dummy word lines, X and Y being integers greater than or equal to one, and
the second word line driver includes,
a first dummy word line driver configured to drive the X first dummy word lines; and
a second dummy word line driver configured to drive the Y second dummy word lines.

5. The memory device of claim 4, wherein X and Y are different integers.

6. The memory device of claim 1, wherein
the second word lines include normal word lines connected to the first memory cell, and
the first memory cell is one of a normal memory cell and a repair memory cell, the normal memory cell being a cell to which data is written, and the repair memory cell being a cell configured to replace the normal memory cell.

7. The memory device of claim 6, further comprising:
a logic gate connected to the normal word lines, the logic gate configured to switch which one of the first word line driver and the second word line driver drive the normal word lines.

8. The memory device of claim 7, wherein
the logic gate is an OR gate configured to drive the normal word lines, when a word line drive signal is received from the first word line driver or the second word line driver.

9. The memory device of claim 6, wherein
the normal word lines included in the second word lines include one of first normal word lines and second normal word lines, the first normal word lines being in a first area having '0' as a most significant bit (MSB), and the second normal word lines being in a second area having '1' as the MSB, and
the test manager is configured to,
control driving of the second normal word lines, when the first word lines are in the first area, and
control driving of the first normal word lines, when the first word lines are in the second area.

10. The memory device of claim 1, further comprising:
a test mode register set configured to output a test signal, when the memory device enters the test mode based on a test mode command.

11. The memory device of claim 1, wherein the test manager is configured to adjust the capacitance of the bit line by adjusting a voltage level of a word line driving voltage applied to the second word lines.

12. The memory device of claim 11, wherein the voltage level of the word line driving voltage is proportional to the capacitance of the bit line.

13. The memory device of claim 1, wherein the memory device is a dynamic random access memory (DRAM).

14. A volatile memory device, comprising:
a memory cell array including a bit line and a plurality of word lines, the bit line simultaneously connected to a first memory cell to be tested and a plurality of second memory cells that are not to be tested, the plurality of word lines connected to respective ones of the plurality of second memory cells, the first memory cell including a first cell capacitor and the plurality of second memory cells each including a second cell capacitor;
a word line driver configured to drive N word lines of the plurality of word lines connected to the respective ones of the plurality of second memory cells in response to a word line enable signal, N being an integer greater than or equal to one; and
a test manager configured to,
receive a test mode command including capacitance information,
outputting the word line enable signal to the word line driver to drive the N word lines of the plurality of word lines based on the test mode command,
control a connection between the second cell capacitor included in each of the plurality of second memory cell associated with the N second word lines.

15. The volatile memory device of claim 14, wherein the test manager is configured to adjust a capacitance of the bit line by controlling, based on the test mode command, a number of the plurality of word lines that are driven.

16. The volatile memory device of claim 14, wherein
the plurality of word lines include a plurality of dummy word lines that do not have addresses, and
the word line driver includes,
a first dummy word line driver configured to drive X dummy word lines among the plurality of dummy word lines, and
a second dummy word line driver configured to drive Y dummy word lines, among the plurality of dummy word lines, X and Y being integers greater than or equal to one.

17. The volatile memory device of claim 14, wherein
the plurality of word lines include a plurality of normal word lines including a first normal word line or a second normal word line, the first normal word line being in a first area having '0' as a most significant bit (MSB), and the second normal word line being in a second area having '1' as the MSB, and
the test manager is configured to,
control driving of the second normal word line, when the first normal word line is in the first area, and
control driving of the first normal word line, when the first normal word line is in the second area.

18. The volatile memory device of claim 14, wherein
each of the plurality of second memory cells include the first cell capacitor and a transistor, the transistor configured to switch the bit line, and
the test manager is configured to adjust a capacitance of the bit line by adjusting a voltage level of a word line driving voltage applied to the transistor.

19. A method of operating a volatile memory device, the volatile memory device including a first memory cell and a second memory cell, the first memory cell being connected to a bit line and the second memory cell being connected to one of a plurality of word lines, the method comprising:
receiving a test mode command including capacitance information;
driving N word lines of the plurality of word lines based on the test mode command, N being an integer greater than or equal to one; and
connecting a cell capacitor included in the second memory cell to the bit line connected to the first memory cell, the first memory cell being a memory cell to be tested.

20. The method of claim 19, wherein the plurality of word lines comprise:
  at least one of normal word lines having addresses associated therewith and dummy word lines not having addresses associated therewith.

* * * * *